(12) United States Patent
Heanue et al.

(10) Patent No.: US 6,856,632 B1
(45) Date of Patent: Feb. 15, 2005

(54) WIDELY TUNABLE LASER

(75) Inventors: John F. Heanue, San Jose, CA (US); John H. Jerman, Palo Alto, CA (US); Jeffrey P. Wilde, Los Gatos, CA (US)

(73) Assignee: Iolon, Inc., San Jose, CA (US)

( * ) Notice: Subject to any disclaimer, the term of this patent is extended or adjusted under 35 U.S.C. 154(b) by 0 days.

(21) Appl. No.: 09/491,429

(22) Filed: Jan. 26, 2000

Related U.S. Application Data

(60) Provisional application No. 60/167,951, filed on Nov. 29, 1999, provisional application No. 60/167,937, filed on Nov. 29, 1999, and provisional application No. 60/154,899, filed on Sep. 20, 1999.

(51) Int. Cl.$^7$ .......................... H01S 3/098; H01S 3/10; H01S 3/08
(52) U.S. Cl. .......................... 372/20; 372/19; 372/99; 372/101; 372/102
(58) Field of Search .......................... 372/19, 20, 38.1, 372/43, 99, 101, 102, 23, 38.02; 310/40; 318/436

(56) References Cited

U.S. PATENT DOCUMENTS

| | | |
|---|---|---|
| 625,971 A | 5/1899 | Gardner et al. |
| 4,460,977 A | 7/1984 | Shimada et al. |
| 4,504,950 A | 3/1985 | AuYeung |
| 4,560,246 A | 12/1985 | Cotter |
| 4,583,227 A | 4/1986 | Kirkby |
| 4,770,047 A | 9/1988 | Arditty et al. |
| 4,839,614 A | 6/1989 | Hill et al. |
| 4,843,233 A | 6/1989 | Jeunhomme |
| 4,847,854 A | 7/1989 | Van Dijk |
| 4,870,269 A | 9/1989 | Jeunhomme et al. |
| 4,932,782 A | 6/1990 | Graindorge et al. |
| 4,994,677 A | 2/1991 | Graindorge |
| 5,028,395 A | 7/1991 | Sebille et al. |
| 5,050,179 A | 9/1991 | Mooradian |
| 5,058,124 A | 10/1991 | Cameron et al. |
| 5,103,457 A | 4/1992 | Wallace et al. |
| 5,115,677 A | 5/1992 | Martin et al. |
| 5,124,993 A | 6/1992 | Braunlich et al. |
| 5,141,316 A | 8/1992 | Lefevre et al. |
| 5,163,063 A | 11/1992 | Yoshikawa et al. |
| 5,172,185 A | 12/1992 | Leuchs et al. |
| 5,181,078 A | 1/1993 | Lefevre et al. |
| 5,181,214 A | 1/1993 | Berger et al. |
| 5,181,717 A | 1/1993 | Donntag et al. |
| 5,185,643 A | 2/1993 | Vry et al. |
| 5,218,610 A | 6/1993 | Dixon |
| 5,225,930 A | 7/1993 | Land et al. |
| 5,263,037 A | 11/1993 | Trutna, Jr. et al. |
| 5,270,791 A | 12/1993 | Lefevre et al. |
| 5,305,330 A | 4/1994 | Rieder et al. |
| 5,319,257 A * | 6/1994 | McIntyre .................... 310/328 |

(List continued on next page.)

FOREIGN PATENT DOCUMENTS

| | | |
|---|---|---|
| EP | 0 924 821 A1 | 6/1999 |
| EP | 0 952 643 A2 | 10/1999 |
| WO | WO 99/37013 | 7/1999 |

OTHER PUBLICATIONS

Akimoto et al, Micro electro mechanical systems (MEMS) and their photonic application, SPIE Proceedings, vol. 3098, Sep. 1997, pp. 374–381.*

Nagaoka Shinji, "Wavelength–Tunable Semiconductor Light Emitting Device", Patent Abstracts of Japan, Publication No. 06188497, Published Jul. 8, 1994, p. 1.

(List continued on next page.)

*Primary Examiner*—Minsun Oh Harvey
*Assistant Examiner*—Armando Rodriguez
(74) *Attorney, Agent, or Firm*—Dorsey & Whitney LLP

(57) ABSTRACT

A Fabry-Perot laser and a micro-actuator are utilized to provide continuous tuning over a range of wavelengths.

19 Claims, 10 Drawing Sheets

U.S. PATENT DOCUMENTS

| | | | |
|---|---|---|---|
| 5,319,668 A | 6/1994 | Luecke | |
| 5,321,717 A | 6/1994 | Adachi et al. | |
| 5,327,447 A | 7/1994 | Mooradian | |
| 5,331,651 A | 7/1994 | Becker et al. | |
| 5,347,527 A | 9/1994 | Favre et al. | |
| 5,349,440 A | 9/1994 | DeGroot | |
| 5,373,515 A | 12/1994 | Wakabayashi et al. | |
| 5,387,974 A | 2/1995 | Nakatani | |
| 5,412,474 A | 5/1995 | Reasenberg et al. | |
| 5,414,280 A | 5/1995 | Girmay | |
| 5,418,800 A | 5/1995 | Prior et al. | |
| 5,420,687 A | 5/1995 | Kachanov | |
| 5,428,700 A | 6/1995 | Hall | |
| 5,434,874 A | * 7/1995 | Fouquet et al. | 372/20 |
| 5,438,579 A | 8/1995 | Eda et al. | |
| 5,444,724 A | 8/1995 | Goto | |
| 5,450,202 A | 9/1995 | Tisue | |
| 5,473,625 A | 12/1995 | Hansen et al. | |
| 5,543,916 A | 8/1996 | Kachanov | |
| 5,583,638 A | 12/1996 | Cutler | |
| 5,594,744 A | 1/1997 | Lefevre et al. | |
| 5,606,439 A | 2/1997 | Wu | |
| 5,631,736 A | 5/1997 | Thiel et al. | |
| 5,651,018 A | 7/1997 | Mehuys et al. | |
| 5,673,129 A | 9/1997 | Mizrahi | |
| 5,712,704 A | 1/1998 | Martin et al. | |
| 5,719,674 A | 2/1998 | Martin et al. | |
| 5,737,109 A | 4/1998 | Goodwin | |
| 5,751,750 A | 5/1998 | Friede et al. | |
| 5,760,391 A | 6/1998 | Narendran | |
| 5,771,252 A | * 6/1998 | Lang et al. | 372/20 |
| 5,777,773 A | 7/1998 | Epworth et al. | |
| 5,802,085 A | 9/1998 | Lefevre et al. | |
| 5,812,716 A | 9/1998 | Ohishi | |
| 5,825,792 A | 10/1998 | Villeneuve et al. | |
| 5,848,092 A | 12/1998 | Mitsumoto et al. | |
| 5,862,162 A | 1/1999 | Maeda | |
| 5,867,512 A | 2/1999 | Sacher | |
| 5,872,881 A | 2/1999 | Rossi et al. | |
| 5,886,785 A | 3/1999 | Lefevre et al. | |
| 5,917,188 A | 6/1999 | Atkinson et al. | |
| 5,929,542 A | * 7/1999 | Ohnstein et al. | 310/40 |
| 5,943,352 A | 8/1999 | Fee | |
| 5,946,331 A | 8/1999 | Amersfoort et al. | |
| 5,991,061 A | 11/1999 | Adams et al. | |
| 5,998,906 A | * 12/1999 | Jerman et al. | 310/309 |
| 6,018,535 A | * 1/2000 | Maeda | 372/20 |
| 6,026,100 A | 2/2000 | Maeda | |
| 6,034,799 A | 3/2000 | Hansen | |
| 6,040,950 A | 3/2000 | Broome | |
| 6,043,883 A | 3/2000 | Leckel et al. | |
| 6,044,095 A | 3/2000 | Asano et al. | |
| 6,061,369 A | 5/2000 | Conradi | |
| 6,064,501 A | 5/2000 | Roberts et al. | |
| 6,081,539 A | 6/2000 | Mattori et al. | |
| 6,084,695 A | 7/2000 | Martin et al. | |
| 6,108,355 A | 8/2000 | Zorabedian | |
| 6,115,121 A | 9/2000 | Erskine | |
| 6,115,401 A | 9/2000 | Scobey et al. | |
| RE37,044 E | 2/2001 | Wu | |
| 6,192,058 B1 | 2/2001 | Abeles | |
| 6,205,159 B1 | 3/2001 | Sesko et al. | |
| 6,215,802 B1 | 4/2001 | Lunt | |
| 6,229,835 B1 | 5/2001 | Tomaru et al. | |
| 6,243,517 B1 | 6/2001 | Deacon | |
| 6,246,480 B1 | 6/2001 | O'Brien | |
| 6,249,364 B1 | 6/2001 | Martin et al. | |
| 6,249,365 B1 | 6/2001 | Mizrahi et al. | |
| 6,252,718 B1 | 6/2001 | Lefevre | |
| 6,282,215 B1 | 8/2001 | Zorabedian et al. | |
| 6,301,274 B1 | 10/2001 | Tayebati et al. | |
| 6,301,280 B1 | 10/2001 | Broutin et al. | |
| 6,304,586 B1 | * 10/2001 | Pease et al. | 372/38.02 |
| 6,314,115 B1 | 11/2001 | Delfyett et al. | |
| 6,321,011 B2 | 11/2001 | Deacon | |
| 6,324,204 B1 | 11/2001 | Deacon | |
| 6,329,737 B1 | * 12/2001 | Jerman et al. | 310/309 |
| 6,330,253 B1 | 12/2001 | Tuganov et al. | |
| 6,331,892 B1 | 12/2001 | Green | |
| 6,337,660 B1 | 1/2002 | Esman et al. | |
| 6,366,689 B1 | 4/2002 | Rao et al. | |
| 6,404,538 B1 | 6/2002 | Chen et al. | |
| 6,404,798 B1 | * 6/2002 | Leckel et al. | 372/108 |
| 6,428,173 B1 | * 8/2002 | Dhuler et al. | 359/872 |
| 6,441,933 B1 | 8/2002 | Jang | |
| 6,463,085 B1 | 10/2002 | Tayebati | |
| 6,493,365 B1 | * 12/2002 | Wu et al. | 372/20 |
| 6,532,091 B1 | 3/2003 | Miyazaki et al. | |
| 2001/0036206 A1 | * 11/2001 | Jerman et al. | 372/20 |
| 2002/0048297 A1 | 4/2002 | Irie et al. | |
| 2002/0126345 A1 | 9/2002 | Green et al. | |
| 2002/0136104 A1 | 9/2002 | Daiber | |

OTHER PUBLICATIONS

Sakurai Atsushi,"Microactuator", Patent Abstracts of Japan, Publication No. 09318888, Published Dec. 12, 1997, p. 1.

Tamura Toshimasa,"External Oscillator Type Variable Wavelength Semiconductor Laser Light Source", Patent Abstracts of Japan, Publication No. 10178240, Published Jun. 30, 1998, p. 1.

Angular Micro–Positioner for Disk Drives, D.A. Horsley et al., Proceedings of the 10th Int. Workshop on Micro Electro Mechanical Systems, 1997 p. 454–458.

Batch Fabricated Area Efficient Milli–Actuators, L.S. Fan et al., Proceedings 1994 Solid State Sensor and Actuator Workshop, Hilton Head, p. 38–42.

Spectrally Narrow Pulsed Dye Laser Without Beam Expander, Michael G. Littman et al., Applied Optics, 1978, vol. 17, No. 14, p. 2224–2227.

Wavelength Lockers Keep Lasers In Line, Ed Miskovic, Photonics Spectra, Feb. 1999, p. 104–110.

24–Ghz Modulation Bandwidth and Passive Alignment of Flip Chip Mounted DFB Laser Diodes. Lindgren et al., IEEE Photonics Technology Letters, vol. 9, No. 3, Mar. 1997.

External Grating Tunable MQW Laser With Wide Tuning Range Of 240nm, Epler et al., Electronics Letters, May 24, 1990, vol. 26, No. 11, p. 742–743.

"Batch–Fabricated Area–Efficient Milli–Actuators", L.–S. Fan, S.J. Woodman, R.C. Moore, L. Crawforth, T.C. Reiley, M.A. Moser, pp. 38–42, 0–9640024–0–X, Solid–State Sensor and Actuator Workshop, Hilton Head, South Carolina, Jun. 13–16, 1994.

"Dual Axis Operation of a Micromachined Rate Gyroscope", Thor Juneau, A.P. Pisano, James H. Smith, pp. 883–886, 0–7803–3829–4/97 IEEE, Transducers '97, 1997 International Conference on Solid–State Sensors and Actuators, Chicago, Jun. 16–19, 1997.

"Angular Micropositioner for Disk Drives", David A. Horsley, Angad Singh, Albert P. Pisano, Roberto Horowitz, pp. 454–459, 0–7803–3744–1/97 ©1997 IEEE.

Favre, F. et al. "External Cavity Semiconductor Laser", *Electronics Letters*, Jan. 17, 1991, vol. 27, No. 2, pp. 183–184.

MacLeod, H.A., "Thin–Film Optical Filters, Second Edition", McGraw–Hill, 1989, pp. 244–269.

Ketelsen, L.J.P., "Simple Technique for Measuring Cavity Loss in Semiconductor Lasers", *Electronic Letters*, Aug. 18, 1994, vol. 30, No. 17, pp. 1422–1424.

Mellis, J. et al., Miniature Packaged External–Cavity Semiconductor Laser with 50 GHz Continuous Electrical Tuning Range, *Electronics Letters*, Aug. 4, 1988, vol. 24, No. 16, pp. 988–989.

Scobey, M., et al., "Stable Ultra–Narrow Bandpass Filters", *SPIE*, vol. 2262, pp. 37–46.

Shtengel, G. E., et al., "Internal Optical Loss Measurements in 1.3μm InGaAsP Lasers", *Electronic Letters*, Jul. 6, 1995, vol. 31, No. 14, pp. 1157–1159.

Siegman, A.E., "LASERS", *University Science Books*, Chapter 11: Laser Mirrors and Regenerative Feedback, Section 11.5 Optical–Cavity Mode Frequencies, pp. 432–440.

Takahashi, H., "Temperature Stability of Thin–Film Narrow–Bandpass Filters Produced by Ion–Assisted Deposition", *Applied Optics*, Feb. 1, 1995, vol. 34, No. 4, pp. 667–675.

* cited by examiner

WIDELY TUNABLE LASER

RELATED APPLICATIONS

This application claims benefit of U.S. provisional patent application Ser. No. 60/154,899 filed Sep. 20, 1999, claims benefit of U.S. provisional patent application Ser. No. 60/167,951 filed Nov. 29, 1999 and claims benefit of U.S. provisional patent application Ser. No. 60/167,937 filed Nov. 29, 1999.

FIELD OF THE INVENTION

The present invention is applicable to the field of tunable lasers and is more specifically applicable to a tunable laser for use in telecommunications.

Introduction

In telecommunications networks that utilize wavelength division multiplexing (WDM), widely tunable lasers enable transmission of information at different wavelengths. Many proposed network configurations require transmitters that can be tuned to transmit at any of N distinct wavelengths. Even in networks where the individual transmitter wavelengths are held fixed, tunable sources are desirable for maintaining stability of the wavelength. Also, because the same part can be used for any channel, a tunable transmitter is useful from an inventory control perspective.

One prior art tunable laser design uses an external optical cavity, which is illustrated in U.S. Pat. No. 5,771,252. A basic configuration from U.S. Pat. No. 5,771,252 is shown in FIG. 1 of the present application. FIG. 1 shows a laser diode used in combination with a diffraction grating and rotating mirror to form an external optical cavity. In this configuration the grating is fixed. As the mirror is rotated, the light propagating within the optical cavity is fed back to the laser diode. The feedback causes the laser diode to "lase" with a changeable frequency that is a function of the rotation angle of the mirror. Unless accounted for, the frequency of the laser may "mode hop" due to the distinct, spatial longitudinal modes of the optical cavity. It is desirable that the longitudinal mode spectrum of the output beam of the laser diode change without discontinuities. This condition may be satisfied by careful selection of the pivot point about which the mirror is rotated, whereby both the optical cavity length and the grating feedback angle can be scanned such that the single pass optical path length of the external optical cavity is equal to the same number of half-wavelengths available across the tuning range of the laser cavity. If this condition is satisfied, rotation of the mirror will cause the frequency of the output beam to change without discontinuities and at a rate corresponding to the rotation of the mirror. U.S. Pat. No. 5,319,668 also describes a tunable laser. Both U.S. Pat. No. 5,771,252 and U.S. Pat. No. 5,319,668 disclose an expression for an optical cavity phase error, which represents the deviation in the number of wavelengths in the cavity from the desired constant value as a function of wavelength. The expression for optical cavity phase error includes terms related to the dispersion of the laser and other optical elements. U.S. Pat. No. 5,771,252 teaches a pivot point whereby the cavity phase error and its first and second derivatives with respect to the wavelength all go to zero at the center wavelength. For all practical purposes, the two methods describe the same pivot point.

The grating-based external cavity tunable laser (ECLs) of 5,771,252 is a relatively large, expensive device that is not suitable for use as a transmitter in a large-scale WDM network. Because of the size and distance between components, assembly and alignment of the prior art ECL above is difficult to achieve. Known prior art ECLs use stepper motors for coarse positioning and piezoelectric actuators for fine positioning of wavelength selective components. Because piezoelectric actuators exhibit hysteresis, precise temperature control is needed. In addition, prior art ECL lasers are not robust in the presence of shock and vibration.

Another prior art tunable laser design utilizes a Vertical-Cavity Surface-Emitting Laser (VCSEL). In one embodiment of this device, a MEMS (micro-electro-mechanical-system) mirror device is incorporated into the structure of the VCSEL and is used to tune the wavelength of the laser. Wide tuning range has been demonstrated in such devices for operation around 830 nm, but so far, the development of a reliable, high performance VCSEL at 1550 nm has proved elusive. This device is very difficult to build because the MEMS device must be physically incorporated into the structure of the VCSEL. Furthermore, development of the MEMS actuators in InP-based materials is a formidable challenge.

In other prior art, angular motors have been used in angular gyroscopes and as fine tracking servo actuators for magnetic heads for disk drives. In "Angular Micropositioner for Disk Drives," D. A. Horsley, A. Singh, A. P. Pisano, and R. Horowitz, Proceedings of the $10^{th}$ Int. Workshop on Micro Electro Mechanical Systems, 1997, p. 454–458, a deep polysilicon device is described with radial flexures extending from a central fixed column, and radial, parallel plate electrodes that effect rotation of less than 0.5 degree. Batch Fabricated Area Efficient Milli-Actuators, L.-S. Fan, et. al., Proceedings 1994 Solid State Sensor and Actuator Workshop, Hilton Head, p. 38–42 shows a rotary flexural actuator with what appears to be 2 central flexures from central supports; the rotational range is not given but appears to be small. Dual Axis Operation of a Micromachined Rate Gyroscope, T. Juneau, A. P. Pisano, and J. H. Smith, Proceedings 1997 Int. Conf. On Solid State Sensors and Actuators, V. 2, pp. 883–890 describes a polysilicon, surface micromachined gyro, which has 4 radial springs supporting a central circular mass. The springs are supported on the outside, and have a small strain relief feature. The angular drive range is not specified, but appears to be small. All of these prior art devices provide limited angular range. These prior art devices completely fill a circular area in a plan view, thus making it difficult or impossible to arrange such an actuator to provide a remote pivot location, as is required by ECLs.

Tunable Distributed Bragg Reflector (DBR) lasers are currently commercially available, however, these lasers have a limited tuning range. Total tuning of about 15 nm and continuous tuning without mode hops over about 5 nm range is typical.

A tunable laser based on sampled grating DBR technology is presently available. The DBR device is tunable over about 50 nm, but the fabrication is difficult and the control electronics are complex, requiring four different control currents.

Another prior art approach to making a tunable laser is to fabricate multiple Distributed Feedback (DFB) lasers on a single chip and couple them together with an arrayed waveguide structure. Each DFB is fabricated with a slightly different grating pitch so that each lases at a slightly different wavelength. Wavelength tuning is accomplished by activating the laser that matches the particular wavelength of interest. The main problems with this approach are cost and insertion loss. Furthermore, fabrication of multiple lasers on the same chip with different operating wavelengths may require direct e-beam writing of the gratings. Also, if one wants to cover a very wide tuning range, the number of lasers required is prohibitively large. Additionally, the multiple laser approach is lossy because coupling N lasers together into one output waveguide results in an efficiency proportional to 1/N.

What is needed, therefore, is a tunable laser that provides advantages over the prior art.

SUMMARY OF THE INVENTION

The present invention comprises a tunable laser assembly. Advantages derived from the present invention include: the ability to use commonly available inexpensive Fabry-Perot (FP) laser diodes; high operating frequencies; reduced size and mass, thermal and mechanical stability; precise alignment of optical components made simple by use of photolithographically-defined features in silicon, high production yields; and simple output frequency control schemes.

The present invention may comprise a tunable laser, including: a source means for providing a light along an optical path with any wavelength selected from a continuous bandwidth of wavelengths; a diffractive element positioned in the optical path and from the source by a first distance to redirect the light; a reflective element positioned in the optical path and from the diffractive element by a second distance to receive the redirected light from the diffractive element, and the reflective element positioned in the optical path and from the diffractive element by the second distance to redirect the light towards the diffractive element; the diffractive element positioned in the optical path and from the source by the first distance to re-direct the light towards the source; and a micro-actuator means for selecting the wavelength from the continuous range of wavelengths by altering the optical path of the light.

The present invention may comprise a laser assembly that includes a source for providing a light along an optical path with any wavelength from a continuous range of wavelengths; a diffractive element positioned in the optical path and from the source by a first distance to redirect the light; a reflective element positioned in the optical path and from the diffractive element by a second distance to receive the redirected light from the diffractive element, and the reflective element positioned in the optical path and from the diffractive element by the second distance to redirect the light towards the diffractive element; the diffractive element positioned in the optical path and from the source by the first distance to redirect the light towards the source; and a micro-actuator for selecting the wavelength from the continuous range of wavelengths by altering the optical path of the light.

The first distance and the second distance may define an optical path length between the source and the reflective element measured in wavelengths, and wherein the optical path length remains constant over the continuous range of wavelengths.

The micro-actuator may be coupled to the reflective element to displace the reflective element. The displacement may comprise an angular displacement. The angular displacement may occur about a virtual pivot point. The displacement may comprise a translation and a rotation. The micro-actuator may comprise a micro-machined actuator. The micro-machined actuator may be coupled to the reflective element. The reflective element may comprise a retroreflector. The continuous range of wavelengths may comprise from about 1520 nm to about 1560 nm. The wavelength may be about 1540 nm. The source may comprise a Fabry-Perot laser.

The present invention may also comprise a tunable laser, including: a source means for providing a light along an optical path with any wavelength selected from a continuous bandwidth of wavelengths; a diffractive element positioned in the optical path and from the source by a first distance to redirect the light; a reflective element positioned in the optical path and from the diffractive element by a second distance to receive the redirected light from the diffractive element, and the reflective element positioned in the optical path and from the diffractive element by the second distance to redirect the light towards the diffractive element; the diffractive element positioned in the optical path and from the source by the first distance to re-direct the light towards the source; and a micro-actuator means for selecting the wavelength from the continuous range of wavelengths by altering the optical path of the light.

The present invention may also comprise a method for providing light with any wavelength selected from a continuous range of wavelengths, including the following steps: providing the light along an optical path; providing a diffractive element in optical path to diffract the light; providing reflective element in the optical path to reflect the light; and selecting a particular wavelength of light from the continuous range of wavelengths by altering the optical path through displacement of a micro-actuator.

The method may also include the step of displacing the reflective element with the micro-actuator to alter the optical path.

The method may also include the step of displacing the reflective element by a translation and a rotation.

The method may also include the step of displacing the micro-actuator about a virtual pivot point.

The method may also include the step of selecting the particular wavelength from a continuous range of wavelengths comprising the range from about 1520 nm to 1560 nm.

DESCRIPTION OF THE INVENTION

Figure 1:
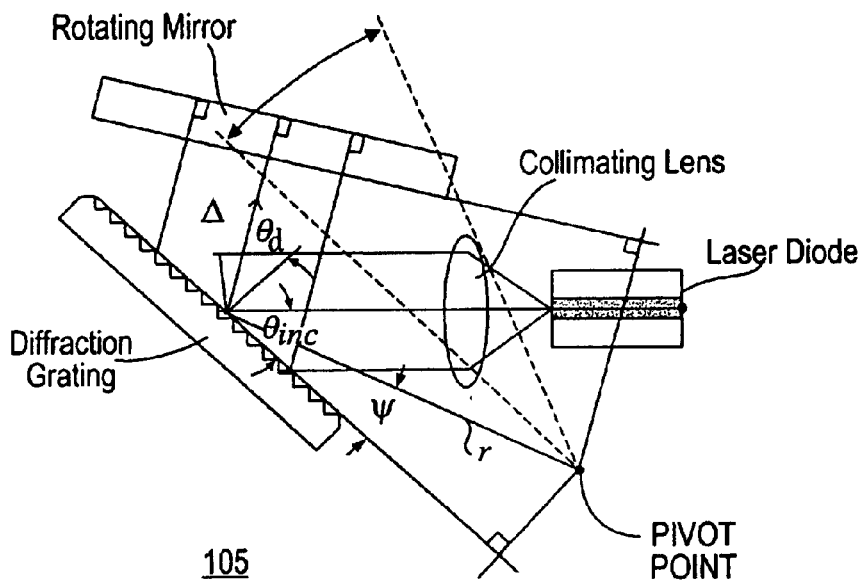
FIG. 1 shows a prior art tunable laser design.
Figure 2:
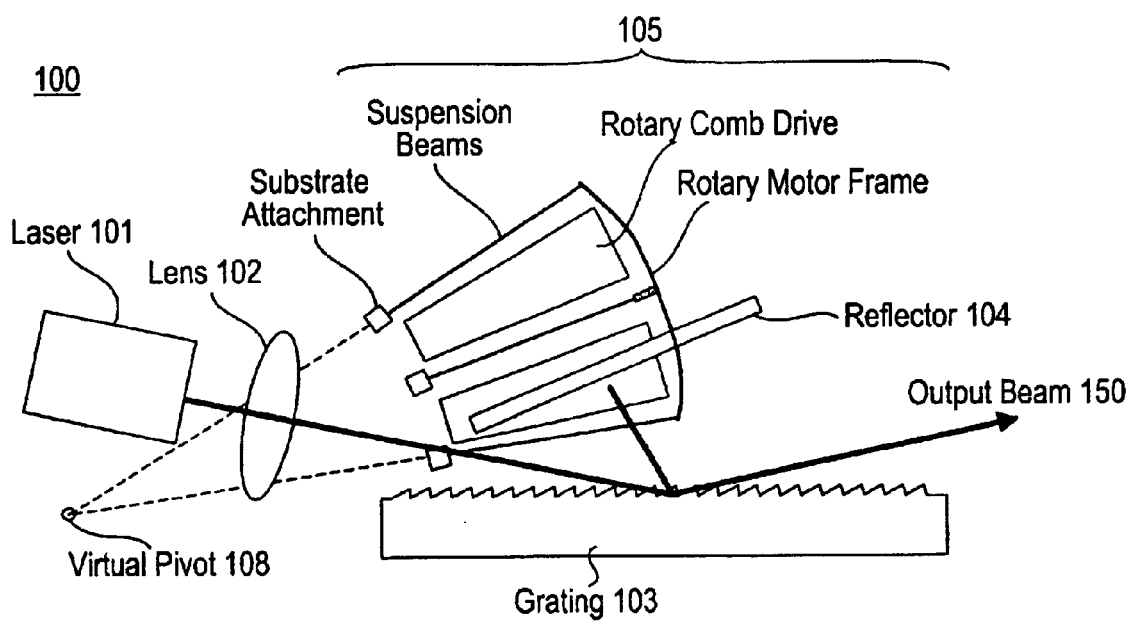
FIG. 2 shows a MEMS based widely tunable external cavity laser of the present invention.

Referring now to FIG. 2, there is seen a preferred embodiment of a micro-electro-mechanical-system (MEMS) based widely-tunable external cavity laser (ECL) of the present invention. Advantages of the present invention over that of the prior art that will be apparent from the description provided below include: the ability to use commonly available inexpensive Fabry-Perot (FP) laser diodes; high operating frequencies; wide operating bandwidth; reduced size and mass, thermal and mechanical stability; precise alignment of optical components made simple by use of photolithographically-defined features in a silicon substrate, high production yields; and simple output frequency control schemes. Other advantages will become apparent from a reading of the following description of the present invention.

In the preferred embodiment, a widely-tunable laser (ECL) 100 of the present invention includes a laser 101, a collimating lens 102, a diffraction grating 103, a reflector 104, and a MEMS based actuator 105. In the preferred embodiment, the actuator 105 is a rotary actuator, the laser 101 is a Fabry-Perot laser diode, and the reflector 104 is a retro-reflector. The reflector 104 utilizes a high reflectivity coating on its surface, and the laser 101 utilizes a high-reflectivity coating on its rear facet and an anti-reflection coating on its front facet. In the preferred embodiment, the grating 103 is replicated in glass. The present invention utilizes because the provide several advantages compared to traditional polymer gratings, including: thermal stability; replication and stability using thin substrates; and the ability to be handled, diced, cleaned, etc.

In the present invention, light from the laser 101 is directed through the lens 102 towards the grating 103, by the grating 103 towards the reflector 104, by the reflector 104 back towards the grating 103, and by the grating 103 back towards the laser 101. The optical path traversed by the light from the laser 101 forms an external cavity, which causes an output beam 150 of the laser 101 to lase at a particular wavelength that is a function of the rotation angle of the reflector 104. In the exemplary embodiment, the ECL 100 can be tuned over +/−26 nm with +/−2 degrees of motion of the actuator 105. For optimum performance of the ECL 100, it is desired that the wavelength of the output beam 150 be continuously tunable (i.e., no mode hops occur as the laser 101 is tuned over a range of wavelengths). This condition can be satisfied by selecting a virtual pivot point 108 about which the reflector 104 rotates and/or translates, such that an optical path length of the cavity formed between a rear facet of the laser 101 and the reflector 104 measured in wavelengths remains constant over the desired tuning range. U.S. Pat. Nos. 5,319,668 and 5,771,252 disclose methods for calculating a pivot point and are incorporated herein by reference. The two calculations made in these two prior art patents result in pivot point locations that differ by 40 nm. The calculations used in both of these patents are applicable to the present invention because the component and manufacturing tolerances of the present invention are greater than 40 nm. In fact, adequate performance of the present invention may be obtained by choosing a pivot point such that the cavity phase error and only the first derivative go to zero at the center wavelength. This condition gives an approximate location for the pivot point. During assembly, the tuning performance of the present invention can be measured, and the pivot point 108 adjusted in a manner described in further detail below. The virtual pivot point of the present invention allows for a compact geometry and results in a lower-cost device with better optical performance than if a real pivot point was used. Better optical performance is achieved because the compact geometry results in greater spacing of the external optical cavity modes and greater side-mode suppression.

In an exemplary embodiment, the optical path length of the external cavity (a sum of the optical distance between the front facet of the laser 101, the grating 103, and the front of the reflector 104) is approximately 5 mm; and the center wavelength, grating pitch, angle of incidence, and diffraction angle of the grating 103 are 1540 nm, 1050 lines/mm, 85 degrees, and 38 degrees, respectively. Although the overall tuning range of the ECL 100 is a function of the width of the gain curve of the laser 101, which in the preferred embodiment of the present invention can be tuned over a range on the order of 40 nm, it is understood that a much broader gain profile may be achievable using, for example, a Fabry-Perot strongly-pumped quantum-well laser design, referenced in *Electronics Letters*, Vol. 26, No. 11, pp. 742–743, "External Grating Laser With Wide Tuning Range of 240 nm," by Epler et al. In the present invention, single-mode operation occurs when the spacing of the external cavity modes are greater than the linewidth of the grating 103. The linewidth of the grating 103 is determined by the angle of incidence and by the beam size. In an exemplary embodiment, the grating 103 linewidth is about 21 GHz and the external cavity modes are spaced by about 30 GHz. The ultimate linewidth is determined by the external cavity mode spacing and by the quality of the external cavity. In the exemplary embodiment, with high reflectivity coatings on the reflector 104 and on the rear facet of the laser 101, the linewidth is less than 1 Mhz.

Figure 3:
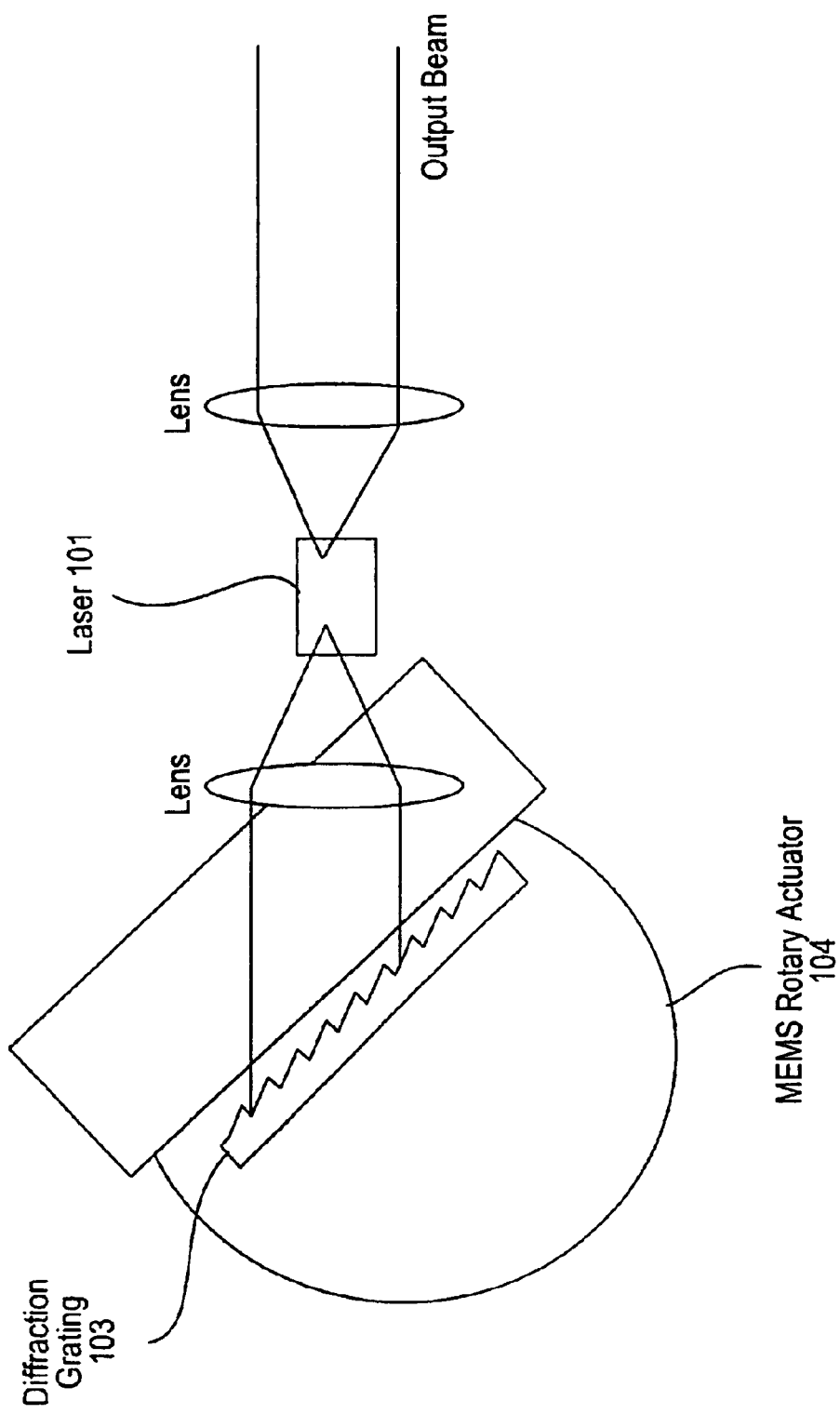
FIG. 3 shows an alternative embodiment of the present invention.

Referring now to FIG. 3, and preceding figures and descriptions as needed, there is seen one alternative of the present invention. The present invention identifies that for high data rate telecommunications applications, the output beam 150 of the ECL 100 of FIG. 2 could be modulated directly by varying the laser 101 current in accordance with the data stream to be transferred. The present invention identifies that long external optical cavity lengths make it more difficult to modulate the ECL 100 at very high frequencies and that it is, therefore, desirable to keep the external optical cavity length of the ECL as short as possible. As illustrated in FIG. 3, it is envisioned that the present invention could be implemented in an alternative embodiment in which the actuator 104 is used to displace the grating 103. In the alternative embodiment of FIG. 3, it is understood that because the grating 103 provides the reflective function of the reflector 103, the reflector need not be used and the optical cavity length can be reduced over that of the preferred embodiment of FIG. 2. However, it is identified that in the alternative embodiment of FIG. 3, single-mode operation of the laser 101 is more difficult to achieve than in the preferred embodiment because the there is only a single-pass reflection of the output beam 150 from the grating.

In another alternative embodiment, a Fabry-Perot laser 101 with as high a relaxation oscillation frequency as possible could be used to achieve high data transfer rates. In this embodiment, the laser should preferably maximize the differential gain, maximize the internal photon density, and minimize the photon lifetime. Multiple-Quantum-Well (MQW) lasers provide these characteristics and have been demonstrated to operate with modulation bandwidths well in excess of 10 GHz. See for example *IEEE Photonics Technology Letters*, Vol. 9, No. 3, pp. 306–308, "24-GHz Modulation Bandwidth and Passive Alignment of Flip-Chip Mounted DFB Laser Diodes", by Lindgren, et al. With this approach, direct modulation of the ECL 100 as high as 2.5 Gb/sec should be possible.

In yet another alternative embodiment, the ECL 100 could be designed to operate at frequencies corresponding to multiples of longitudinal mode spacing (i.e., multiples grater than the relaxation oscillation frequency). This approach would have the drawback of decreasing the mode spacing and increasing the overall size of the ECL 100.

Figure 4:
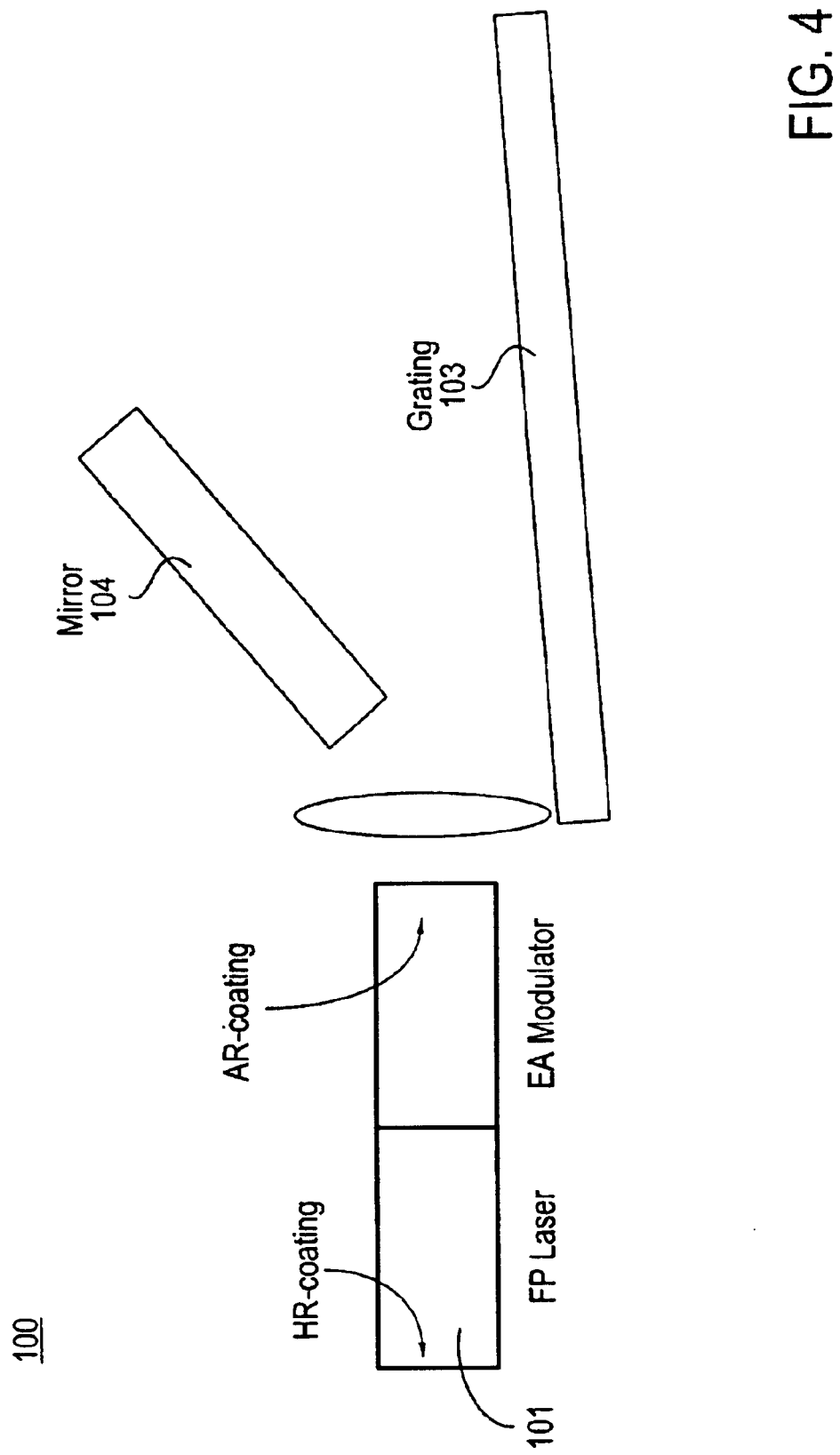
FIG. 4 shows the use of an electro-absorptive modulator in an embodiment of the present invention.

Referring now to FIG. 4, and preceding figures and descriptions as needed, there is seen an integrated electro-absorptive modulator as used in a preferred embodiment of the present invention. In an alternative embodiment, the present invention identifies that an electroabsorptive (EA) modulator could also be used to achieve high data transfer rates. At high data rates, however, a decrease in laser modulation response occurs. This decrease can be understood by considering the characteristic lifetimes of photons. Photon lifetime for the laser 101 is given by $1/(c \cdot \alpha)$, where $\alpha$ is the total loss distributed over the equivalent free-space cavity. In a solitary laser, a photon spends all its time in a highly absorbing medium so that the photon lifetime is short. In the ECL 100, the photon spends a large fraction of the time in loss-less free-space, so the lifetime is proportionally longer. When modulating the ECL 100 at high frequency, it is desirable that the photons disappear when the current is turned off, but, this does not happen fast enough when the photon lifetime is long. The present invention identifies that if short photon lifetime is desired, the EA modulator could be positioned in the external optical cavity as shown in FIG. 4. An advantage with this approach is that the EA modulator can be fabricated on the same chip as the laser 101. Because the EA modulator absorbs photons at a speed corresponding to its modulation frequency, it can be used to overcome the problems associated with long photon lifetime. In an exemplary embodiment, the EA modulator may be used to modulate the output beam 150 at up to 10 Gbits/sec.

Figure 5:
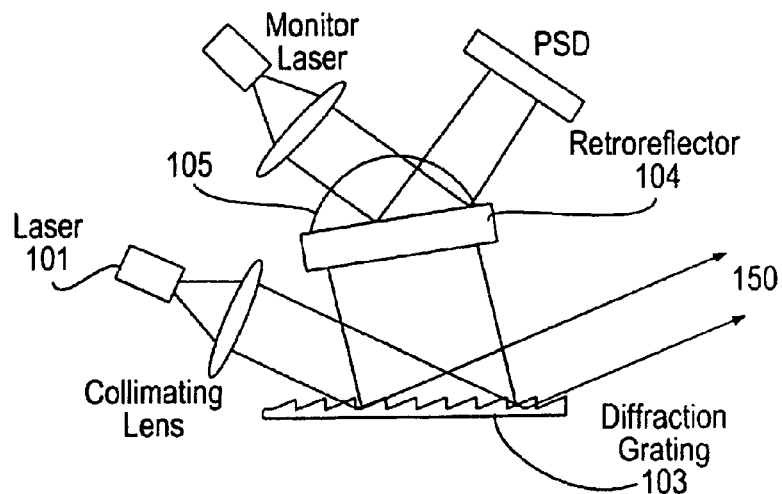
FIG. 5 shows an embodiment in which a PSD is used.

Referring now to FIG. 5 and preceding figures and descriptions as needed, there is seen an embodiment in which a position sensing detector (PSD) is used for servo-control of the actuator. In the embodiment of FIG. 5, a PSD is used to measure the angle of a reference beam of light that is reflected from the reflector 104. The signal from the PSD is used in a servo loop to set the voltage on the actuator 105. An advantage of this embodiment is that the wavelength of the reference beam can be matched to the sensitivity of commercially available PSDs.

Figure 6:
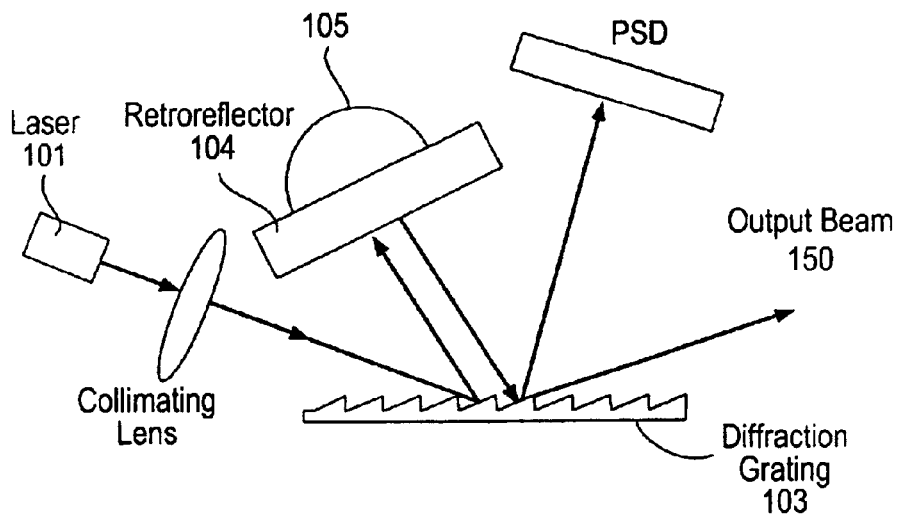
FIG. 6 shows a second embodiment in which a PSD is used.

Referring now to FIG. 6 and preceding figures and descriptions as needed, there is seen a third embodiment in which a PSD is used for servo control. In the embodiment of FIG. 6, the grating 103 comprises wide enough grooves such that both first and second order diffracted output beams are produced from the beam 150. Either the first order or the second order beam can be directed to the PSD to find the angle of the reflector 104.

Figure 7:
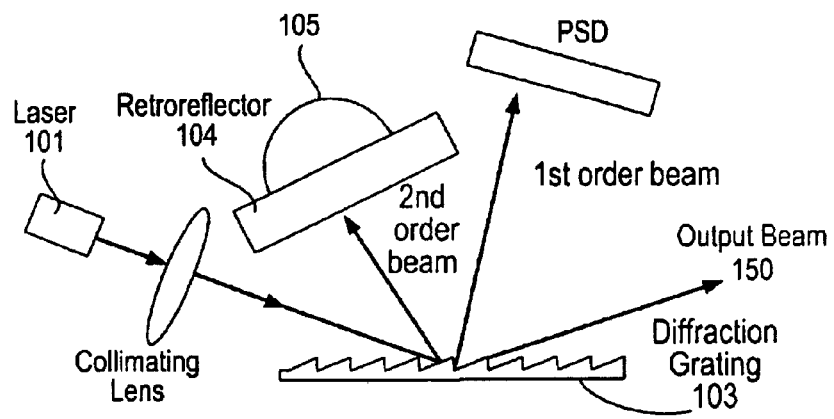
FIG. 7 shows a third embodiment in which a PSD is used.

Referring now to FIG. 7, and preceding figures and descriptions as needed, there is seen a second embodiment in which a PSD is used for servo control. In the embodiment of FIG. 7, the first order diffracted beam is reflected from the grating 103 after reflection by the mirror 104 and is measured by a PSD to measure the wavelength of the output beam 150. The signal from the PSD is used in a servo loop to set the voltage of the actuator 105. It is understood that in the embodiments of FIGS. 5–7, the signal from the PSD can also be used for servo control of the power of the laser 101.

In an alternative embodiment to those of FIGS. 5–7, a capacitance measurement of the actuator 105 can be used as an indication of the position of the attached reflector 104. As discussed previously, movement of the reflector 104 determines the output wavelength of the ECL 100. The present invention identifies that the movement can be measured as a capacitance change in the actuator 105. In this embodiment, the output wavelength vs. the capacitance of the actuator 105 may be measured, and capacitance sensing electronics comprising a servo-loop may be used to maintain the position of the actuator 105 (and therefore the laser wavelength) fixed over time. This method of servo control can be implemented at low cost and does not require extra optical components. Because the capacitance of the actuator 105 and performance of the capacitance-sensing electronics are temperature dependent, a thermo-electric cooler (TEC) may need to be used to stabilize the temperature of the ECL 100.

In yet another alternative embodiment to those of FIGS. 5–7, the wavelength vs. capacitance behavior of the actuator 105 may measured at a number of different temperatures. In this embodiment, a thermistor could be used to measure temperature, which in turn could be used to determine which values to use for servo control. In an exemplary embodiment, a stability of better than 1 part in 1000 is achievable with capacitance sensing.

Figure 8:
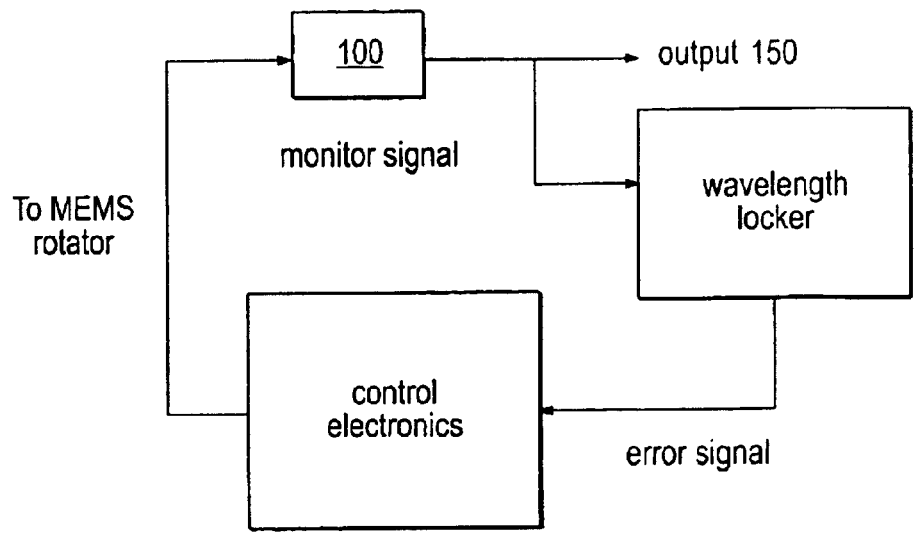
FIG. 8 shows an embodiment in which a wavelength locker is used.

Referring now to FIG. 8 and preceding figures and descriptions as needed, there is seen an embodiment of a wavelength locker as used with the present invention. The present invention identifies that in an alternative approach to that of FIGS. 5–7, a wavelength locker may be used to stabilize the wavelength of the ECL 100. For a discussion of wavelength locking techniques, see "Wavelength lockers keep lasers in line," Photonics Spectra, February 1999, pp. 104–110 by Ed Miskovic. Similar techniques can be used to stabilize the wavelength of the present invention. The error signal from the wavelength locker may be used in a servo loop to set the voltage applied to the actuator 105. In the embodiment of FIG. 8, the wavelength locker is external to the ECL 100 and a monitor signal is split off from the output beam 150 by an optical beam splitter. The disadvantage of this approach is that the output beam 150 intensity is reduced.

Figure 9:
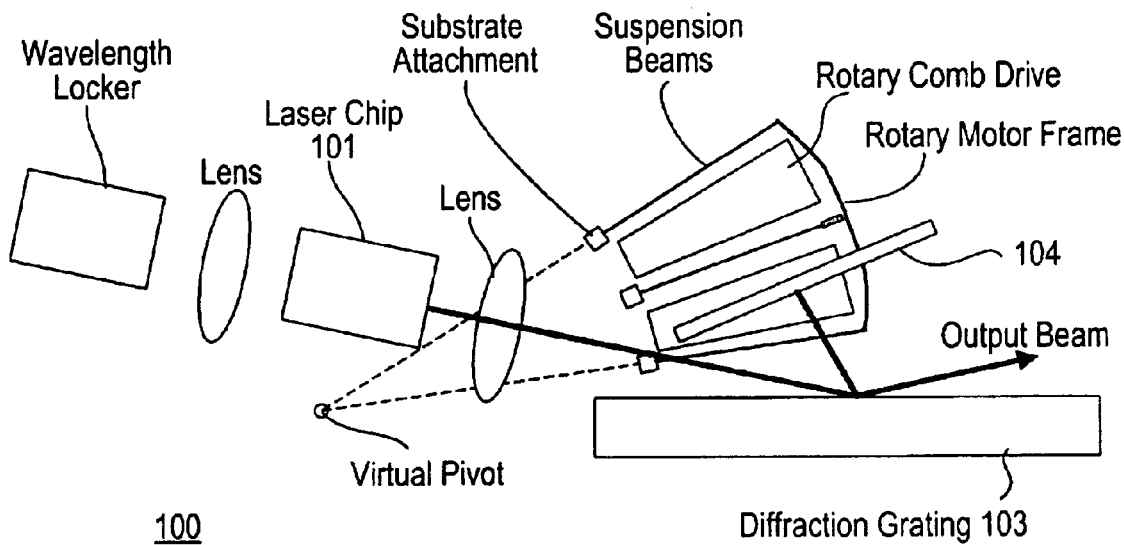
FIG. 9 shows a second embodiment in which a wavelength locker is used.

Referring now to FIG. 9, and preceding figures and descriptions as needed, there is seen another embodiment of a wavelength locker as used with the present invention. In the embodiment of FIG. 9, light from the rear facet of the laser 101 is directed to the wavelength locker, which may or may not be located within the ECL 100 itself. In the embodiments of FIGS. 8 and 9, the present invention identifies that the wavelength locker can also be used to servo control the power of the laser 101.

Figure 10:
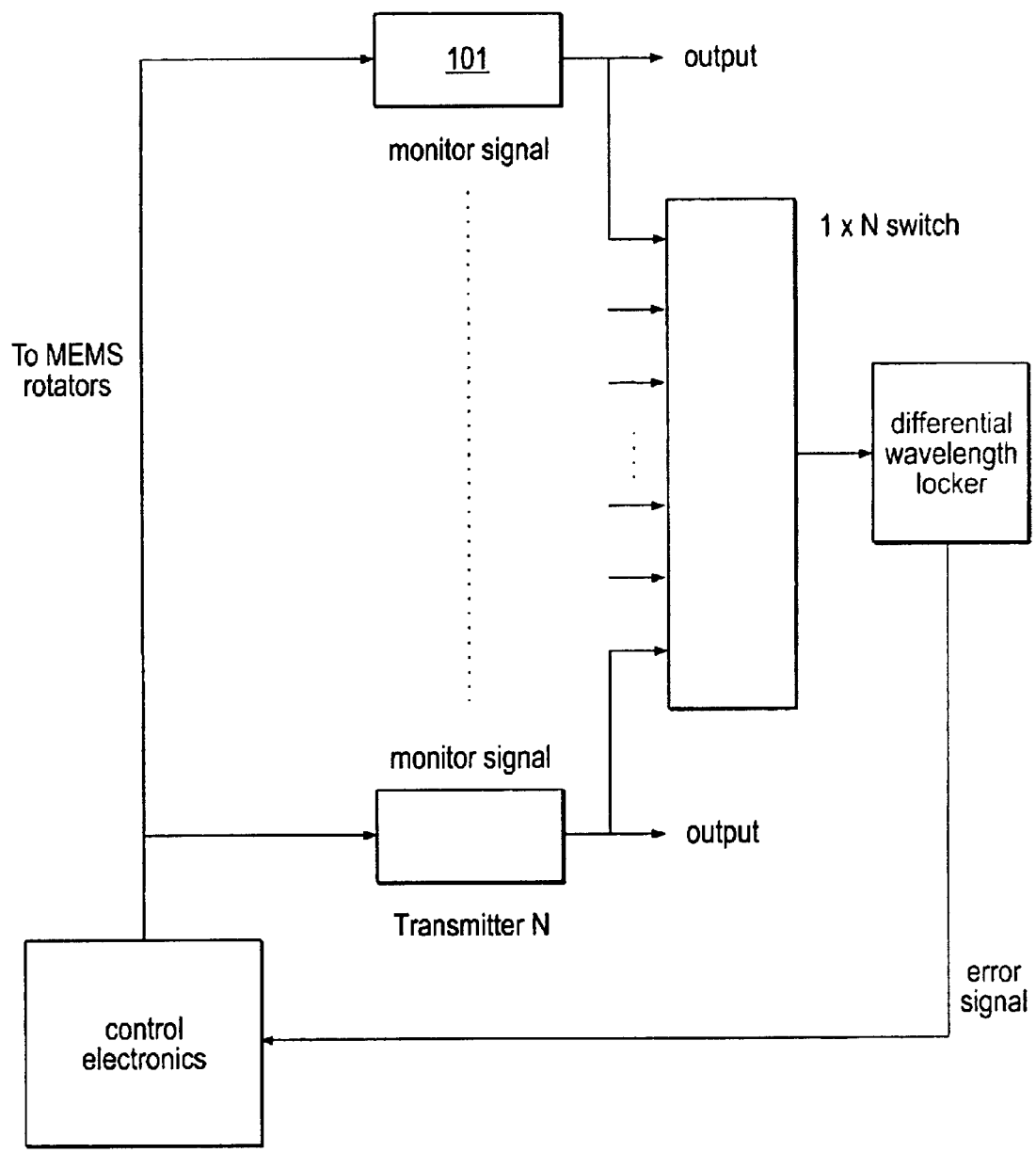
FIG. 10 shows a third embodiment in which a wavelength locker is used.

Referring now to FIG. 10, and preceding figures and descriptions as needed, there is seen another embodiment of a wavelength locker as used with the present invention. In an embodiment in which the wavelength of the output beam 150 of at least one ECL 100 needs to be checked for stability only intermittently, the present invention identifies that a single wavelength calibrator/locker 108 can be shared to maintain a particular wavelength of a particular ECL 100. In the embodiment of FIG. 10, a 1×N switch is used to direct a monitor signal from a ECL 100 to the locker 108. Elimination of N−1 wavelength calibrators/lockers 108 represents a significant cost saving.

Figure 11:
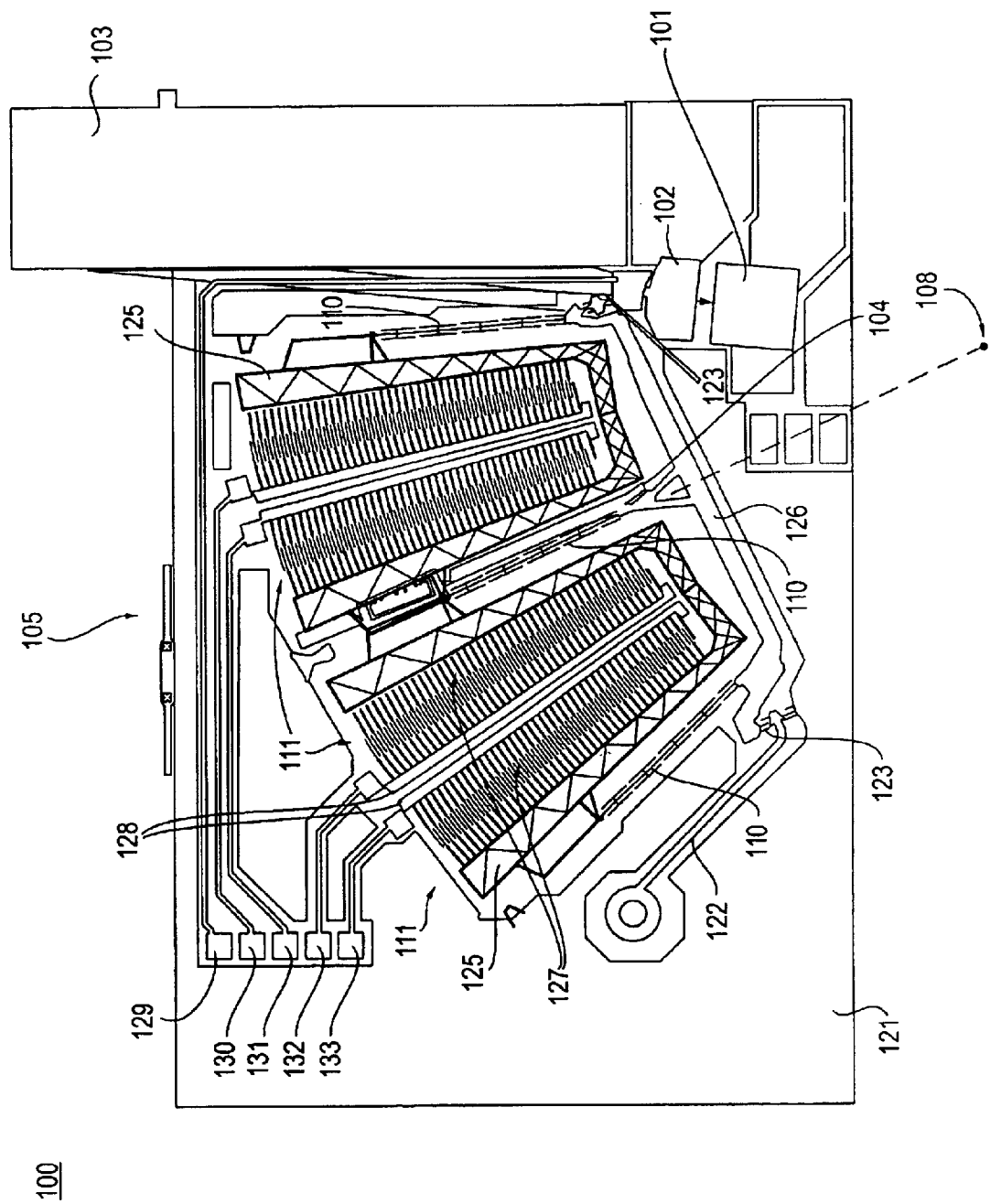
FIG. 11 shows a mask layout of the actuator of the present invention.

Referring now to FIG. 11, and preceding figures and descriptions as needed, there is seen a detailed view of a mask layout for the MEMS based actuator 105 of the present invention. In the preferred embodiment, rotation of the actuator 105 about the virtual pivot point 108 acts to rotate and translate the mirror 104 such that the external optical cavity is maintained with a constant length over the entire rotation angle of the actuator. The present invention identifies that changes in the geometrical relationship between the components comprising the ECL 100 may change due to temperature and/or mechanical effects and that, in doing so, the optical path length of the external optical cavity and thus the wavelength of the output beam 150 may change. As is discussed below, the actuator 105 is designed to provide a mechanism which compensates for these changes.

In the preferred embodiment, the actuator 105 is manufactured from the mask shown in FIG. 11 using well known micro-machining process steps. The actuator 105 comprises: a silicon substrate 121, two sets of comb drive elements 111, bars 128, suspended trusses 125, suspension beams 110, a suspended frame 126, flexural couplers 123, and a suspended lever 122. The silicon substrate 121 comprises etched features for receiving the laser 101, the lens 102, and the diffraction grating 103. Each of the comb drive elements 111 comprises two sets of interlocking teeth 127. The interlocking teeth 127 comprise a plurality of fixed teeth that are coupled by a respective bar 128 to the silicon substrate 121, and a plurality of movable teeth that are coupled to a respective movable truss 125. The bars 128 are coupled through respective electrical connections to respective bond pads 129–133. Although it is preferred that the individual teeth 127 comprising the comb drive elements 111 lie on circumferential arcs centered about the pivot point 108, it is not necessary for the ends of the teeth 127 to lie along radial lines extending from the center of rotation. The ends of some of the teeth 127 may be arranged to lie along a line that does not pass through the center of rotation, which would allow the bars 128 to be made with added thickness along the ends that point towards the pivot point 108 and yet sufficient electrical isolation air-gap therebetween. Each of the trusses 125 is suspended by respective suspension beams 110. The suspension beams 110 are coupled to the suspended frame 126, which is attached at its ends to the substrate 121 by two sets of flexural couplers 123. One of the flexural couplers 123 serves as an electrical ground connection to the upper bond pad 129. The other flexural coupler is attached to the suspended lever 122. The trusses 125, the suspensions 110, the frame 126, and the lever 122 are all suspended above the substrate 121. The reflector 104 is attached to a slot in one of the trusses 125 by a mating post, springs, adhesive, solder, or similar attachment means. In the exemplary embodiment, the reflector 104 is about 2 mm long by 400 um high. A reflective surface of the reflector 104 is perpendicular to the horizontal plane of the actuator 105. The mass and size of the reflector 104 is taken into account by the design of the actuator 105, which is designed to maintain mechanical stability.

In the preferred embodiment, a potential applied to bond pads 131 and 133 causes an electro-static potential to be created between the respective fixed and movable teeth of the comb drive elements 111, which causes the trusses 125 to rotate clockwise about the virtual pivot point 108. A potential applied to bond pads 130 and 132 causes the trusses 125 to rotate counter-clockwise. In the preferred embodiment, when the lever 122 is moved (for example, manually or by other movement means such as micromachined actuator or the like) the coupler 123 that is attached to the lever 122 rotates around a point near its center. The opposite coupler 123 that is not connected to the lever 122 causes the small rotation of the first coupler to be converted into a translational motion along an axis extending through the two couplers. By arranging the couplers 123 to be generally parallel to the optical axis of the external optical cavity, motion of the lever 122 can be used to adjust the external optical cavity length independent of the rotation of the actuator 105. The adjustments can be made as required to compensate for changes in temperature or variations in the optical cavity length, or to compensate for small offsets in the virtual pivot point 108.

The present invention takes into consideration that the comb drive elements 111 may become unstable and "snapover" in the radial direction if the radial stiffness of the suspension beams 110 falls below a value equal to the derivative of the electrostatic force between the comb drive elements 111 with respect to radial motion, and that this instability becomes more severe with large, static angular deflection. Although folded beam suspension designs are known by those skilled in the art to provide large rotational range, they do so with a penalty of reduced out-of-plane and radial stiffness, which would work against the desired goal of maintaining mechanical stability. The present invention identifies a novel and new design that takes into consideration the limitations of folded beam designs and instead utilizes the "straight-beam" suspension beams 110 described above. As described above, the basic structure for the actuator 105 is to use 2 or more suspensions 110 that are radially disposed around the axis of rotation of the actuator 105. In the preferred embodiment, 2 or 3 beams are used and are spaced 20–30° apart with respect to the rotation axis. It is understood that if larger angles of rotation are desired, the size of the actuator 105 would be increased. In the preferred embodiment, the rotary comb drive elements 111 are arranged around the suspension beams 110, and can either be contained between the suspension beams, or connected outside the beams. If the comb drive elements 111 are arranged over an arc of about 120°, it may be advantageous to have three suspension beams 110 arranged at 60° spacing.

In the preferred embodiment, the actuator 105 is fabricated from a high aspect ratio process, which can also include plated metal processes, for example, Lithographie, Gavanometrie and Abformung (LIGA) process well known in the art. LIGA processing techniques result in structures that comprise vertical dimensions substantially greater than the horizontal width of the smallest features of the actuator 105. With these processes, the resulting stiffness of the actuator 105, the motion of the actuator may be constrained to be substantially in the plane of the actuator.

Figure 12:
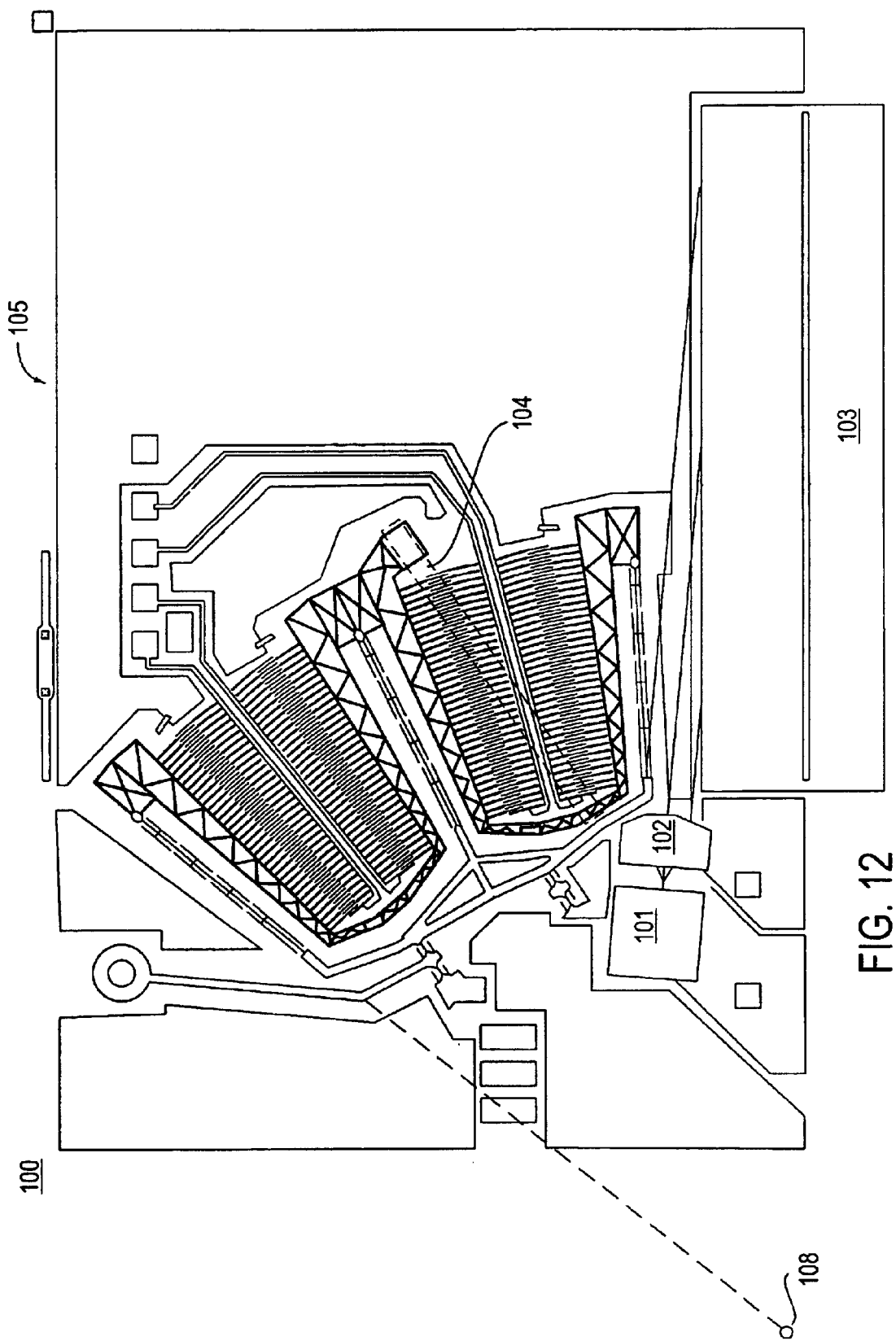
FIG. 12 shows another mask layout of the actuator of the present invention.

Referring now to FIG. 12, and preceding figures and descriptions as needed, there is seen a second mask layout for an actuator of the present invention. The layout of FIG. 12 is similar to the layout of FIG. 11, except that the virtual pivot point 108 location is changed and some aspects of the grating 103 and the angle of the reflector 104 with respect to the grating are slightly different.

Figure 13:
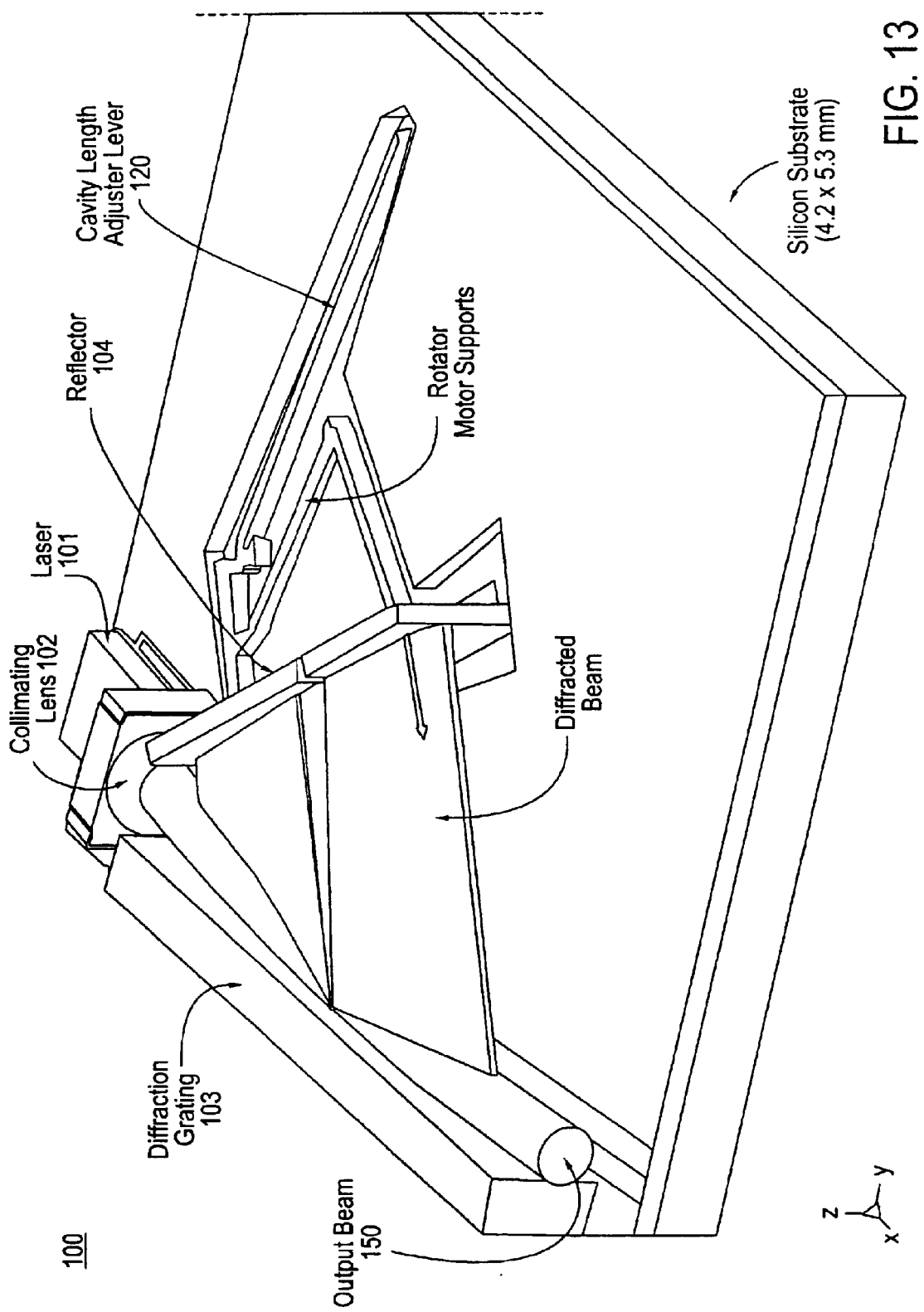
FIG. 13 shows a 3d view of the present invention.

Referring now to FIG. 13, and preceding figures and descriptions as needed, a 3D view of the present invention including: laser diode 101, lens 102, grating 103, reflector 104, and output beam 150, is shown. As seen in FIG. 13, the output beam 150 is quite narrow along one axis, but the small incident angle of the beam on the grating 103 causes the diffracted beam to be extended along a perpendicular axis.

Figure 14:
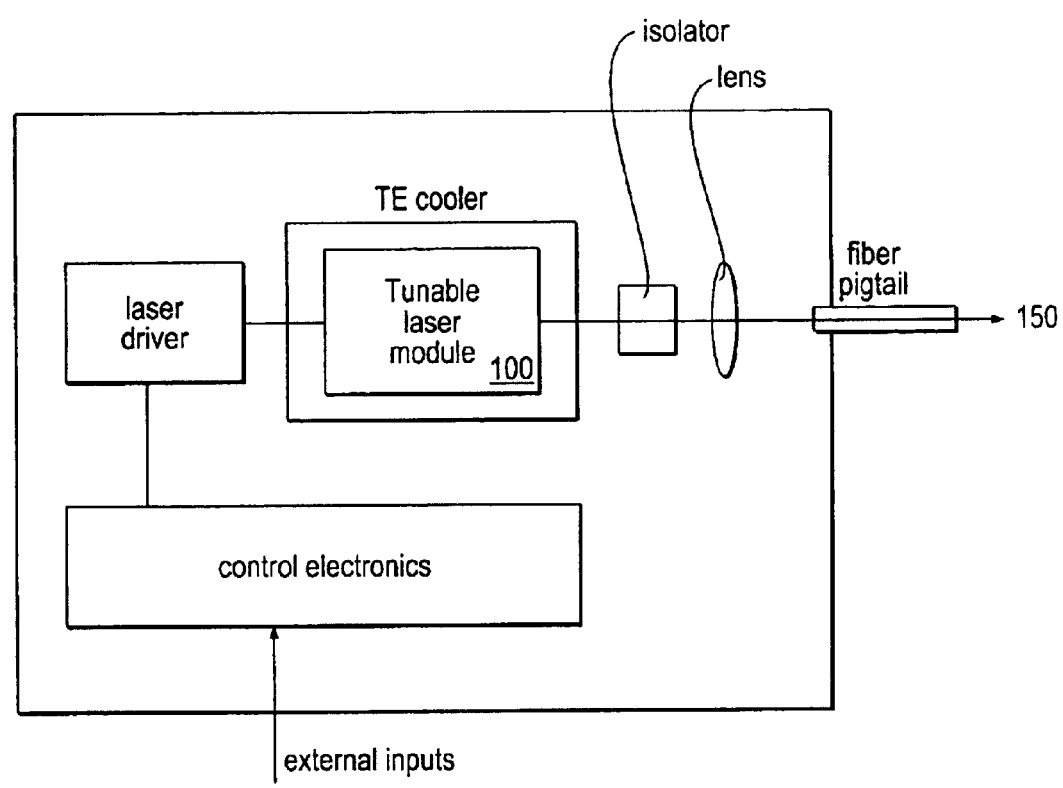
FIG. 14 shows a module incorporating the present invention.

Referring now to FIG. 14, and preceding figures and descriptions as needed, there is seen a module 106 incorporating the ECL 100. The ECL 100 comprises a very small size and mass, which enables the use of simple closed-loop methods to control the components to accurately set and hold the wavelength of the output beam 150. In contrast to the prior art, which may require novel laser structures, such as, for example, a long-wavelength vertical-cavity surface-emitting laser (VCSEL), the present invention can be implemented using a inexpensive Fabry-Perot laser as the laser 101, which is readily available in large quantities at low prices. Use of a Fabry-Perot laser in the present invention is further beneficial because, unlike VCSELs, they can operate at long operating wavelengths, for example, up to and over 1700 nm, and in particular 1540 nm, which is one wavelength currently used by telecommunications equipment.

Because the laser 101 and actuator 105 of the present invention can be made separately, the wafer fabrication processes for their manufacture can be made simpler, which can provide higher manufacturing yields than the prior art.

The present invention identifies that, other than in the embodiment described above in which capacitance sensing is used for servo control, the ECL 100 exhibits sufficient thermal stability such that a thermo-electric cooler need not be used. This is an advantage because TE coolers can be relatively unreliable and are prone to fail.

Because the rotation angle of the MEMS actuator 105, and hence the reflector 104, can be held steady under simple closed loop control, the wavelength of the output beam 150 may also be held steady. Furthermore, unlike prior art tunable VCSELs, in which wavelength vs. actuator voltage must be re-calibrated as the laser ages, the stable dispersive properties of the diffraction grating 103 of the present invention do not change with age, such that after an initial calibration step, further calibration of the module 106 is not necessarily required. Even if in some embodiments the wavelength of the output beam 150 can not be held stable over the lifetime of the module 106, the wavelength stability of the present invention is good enough such that only intermittent re-calibration is envisioned.

Although, the foregoing discussion has presented particular embodiments of the present invention, it is to be understood that the above description is not to be limited to only the described telecommunications application and embodiments. For example, other applications include: remote sensing or spectroscopy applications. It will also be appreciated by those skilled in the art that it would be possible to modify the size, shape, appearance and methods of manufacture of various elements of the invention, or to include or exclude various elements and stay within the scope and spirit of the present invention. Thus, the invention should be limited only by the scope of the claims as set forth below.

What is claimed is:

1. A tunable single mode laser microassembly operable over a range of wavelengths comprising a source for providing a light along an optical path with any wavelength from the range of wavelengths, a diffractive element positioned in the optical path and spaced from the source by a first distance to redirect the light, a reflective element positioned in the optical path and spaced from the diffractive element by a second distance to receive the redirected light from the diffractive element and to redirect the light back towards the diffractive element, the light being redirected by the diffractive element back towards the source, and a micro-dimensioned actuator coupled to one of the diffractive element and the reflective element for causing angular movement of such element to permit selection of a single wavelength from the range of wavelengths by altering the optical path of the light.

2. The laser microassembly of claim 1, wherein the first distance and the second distance define an optical path length between the source and the reflective element measured in wavelengths, and wherein the optical path length remains approximately constant over the range of wavelengths.

3. The laser microassembly of claim 1 wherein the actuator is coupled to the reflective element to cause angular movement of the reflective element.

4. The laser microassembly of claim 1, wherein the actuator provides sufficient angular movement of such element to permit selection of a single wavelength from a range of wavelengths extending over approximately 40 nanometers.

5. The laser microassembly of claim 1, wherein the angular movement occurs about a virtual pivot point.

6. The laser microassembly of claim 1, wherein the angular movement comprises a translation and a rotation.

7. The laser microassembly of claim 1, wherein the actuator comprises a micro-machined actuator.

8. The laser microassembly of claim 1, wherein the micro-machined actuator is coupled to the reflective element.

9. The laser microassembly of claim 8, wherein the reflective element comprises a retro-reflector.

10. The laser microassembly of claim 1, wherein the range of wavelengths comprises from about 1520 nm to about 1560 nm.

11. The laser microassembly of claim 1, wherein the actuator is an electrostatic micro-actuator.

12. The laser microassembly of claim 10, wherein the micro-machined actuator is a rotatable micro-actuator.

13. A tunable laser comprising source means for providing a light along an optical path with any wavelength selected from a bandwidth of wavelengths, a diffractive element positioned in the optical path and spaced from the source by a first distance to redirect the light, a reflective element positioned in the optical path and spaced from the diffractive element by a second distance to receive the redirected light from the diffractive element and to redirect the light back towards the diffractive element, the light being redirected by the diffractive element back towards the source, and a micro-machined actuator for selecting the wavelength from the bandwidth of wavelengths by altering the optical path of the light between the diffractive element and the reflective element, the actuator having a substrate as a base and a movable micro-machined structure overlying the substrate.

14. The tunable laser of claim 13, wherein the source comprises a Fabry-Perot laser.

15. A method for using a tunable single mode laser microassembly to provide light with any wavelength selected from a range of wavelengths, comprising the steps of providing the light along an optical path, providing a diffractive element in the optical path to diffract the light, providing a reflective element in the optical path to reflect the light and selecting a single wavelength of light by altering the optical path of the light by means of a micro-machined actuator coupled to the reflective element for causing angular movement of the reflective element.

16. The method of claim 15, wherein the actuator is an electrostatic micro-actuator.

17. The method of claim 15, wherein the selecting step includes the step of moving the reflective element by a translation and a rotation.

18. The method of claim 15, wherein the selecting step includes the step of moving the reflective element about a virtual pivot point.

19. The method of claim 15, further comprising the step of selecting the particular wavelength from a range of wavelengths comprising the range of from about 1520 nm to about 1560 nm.

* * * * *